United States Patent
Qian

(10) Patent No.: US 8,816,400 B2
(45) Date of Patent: *Aug. 26, 2014

(54) SIGE HBT HAVING DEEP PSEUDO BURIED LAYER AND MANUFACTURING METHOD THEREOF

(71) Applicant: Shanghai Hua Hong Nec Electronics Co., Ltd., Shanghai (CN)

(72) Inventor: Wensheng Qian, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/671,587

(22) Filed: Nov. 8, 2012

(65) Prior Publication Data

US 2013/0113021 A1    May 9, 2013

(30) Foreign Application Priority Data

Nov. 8, 2011    (CN) .......................... 2011 1 0350565

(51) Int. Cl.
   *H01L 29/737*    (2006.01)

(52) U.S. Cl.
   USPC ........... 257/197; 257/517; 257/519; 257/526; 257/590; 257/E29.188

(58) Field of Classification Search
   USPC ........... 257/197, 517, 519, 526, 590, E29.188
   See application file for complete search history.

(56) References Cited

U.S. PATENT DOCUMENTS

| | | | | |
|---|---|---|---|---|
| 2007/0085167 A1* | 4/2007 | Saitoh et al. | ................... | 257/565 |
| 2008/0211064 A1* | 9/2008 | Orner et al. | ................... | 257/622 |
| 2008/0237706 A1* | 10/2008 | Williams et al. | ............... | 257/343 |
| 2008/0237782 A1* | 10/2008 | Williams et al. | ............... | 257/513 |
| 2008/0237783 A1* | 10/2008 | Williams et al. | ............... | 257/513 |
| 2009/0146258 A1* | 6/2009 | Zhang et al. | ................... | 257/592 |
| 2011/0073944 A1* | 3/2011 | Tsukihara | ..................... | 257/337 |
| 2012/0098095 A1* | 4/2012 | Lin et al. | ....................... | 257/565 |
| 2013/0082353 A1* | 4/2013 | Kuo et al. | ..................... | 257/591 |
| 2013/0119433 A1* | 5/2013 | Wang | ............................ | 257/146 |

* cited by examiner

*Primary Examiner* — Victor A Mandala

(74) *Attorney, Agent, or Firm* — MKG, LLC

(57) ABSTRACT

A silicon-germanium (SiGe) heterojunction bipolar transistor (HBT) having a deep pseudo buried layer is disclosed. The SiGe HBT includes isolation structures formed in trenches, first pseudo buried layers and second pseudo buried layers, and a collector region. The first pseudo buried layers are formed under the respective trenches and the second pseudo buried layers are formed under the first pseudo buried layers, with each first pseudo buried layer vertically contacting with a second pseudo buried layer. The second pseudo buried layers are laterally connected to each other, and the collector region is surrounded by the trenches, the first pseudo buried layers and the second pseudo buried layers. The cross section of each of the trenches has a regular trapezoidal shape, namely, each trench's width of its top is smaller than that of its bottom. A manufacturing method of the SiGe HBT is also disclosed.

16 Claims, 5 Drawing Sheets

SIGE HBT HAVING DEEP PSEUDO BURIED LAYER AND MANUFACTURING METHOD THEREOF

CROSS-REFERENCES TO RELATED APPLICATIONS

This application claims the priority of Chinese patent application number 201110350565.9, filed on Nov. 8, 2011, the entire contents of which are incorporated herein by reference.

TECHNICAL FIELD

The present invention generally relates to a heterojunction bipolar transistor (HBT), and more particularly, to a silicon-germanium (SiGe) HBT and a manufacturing method thereof.

BACKGROUND

The most important step in the fabrication of a silicon-germanium (SiGe) heterojunction bipolar transistor (HBT) is the formation of buried layers for a collector region, which are capable of reducing the current amplification coefficient of a parasitic transistor consisted of a base region, the collector region and a substrate and thus to lower the saturation voltage drop of the device. The formation of the buried layers is not necessary for a high-speed SiGe HBT which has a heavily doped collector region, whilst it is required as necessary for a high-voltage SiGe HBT which has a lightly doped collector region.

Referring to FIG. 1 which illustrates a structure of a SiGe HBT of the prior art. The structure is as follows: two trenches 12 are formed in a substrate 11 and each trench is filled with a dielectric material which serves as an isolation structure; two pseudo buried layers 13 are formed under the respective trenches 12; a collector region 14 is formed in the portion of the substrate 11 between the two trenches 12 and the two pseudo buried layers 13; first dielectric portions 15 and a T-shaped SiGe base region 16 are formed above the collector region 14, and the first dielectric portions 15 are respectively located under two extending portions of the T-shaped SiGe base region 16; a sidewall 19b is formed above each of the isolation structure, on each outer side of the first dielectric portions 15 and the T-shaped SiGe base region 16; second dielectric portions 17 and a T-shaped polysilicon emitter 18 are formed on the SiGe base region 16, and the second dielectric portions 17 are located under two extending portions of the T-shaped polysilicon emitter 18, respectively; a sidewall 19a is formed above the T-shaped SiGe base region 16, on each outer side of the second dielectric portions 17 and the T-shaped polysilicon emitter 18; a third dielectric (also referred to as an interlayer dielectric) 113 is formed on the surface of the substrate, and a first hole 110, second holes 111 and third holes 112, each being filled with a metal electrode, are formed in the third dielectric layer; the emitter 18 is in contact with the electrode within the first hole 110; the SiGe base region 16 is in contact with electrodes within the second holes 111; and the pseudo buried layers 13 are in contact with the electrodes within the third holes 112.

In the above SiGe HBT, the cross section of each trench 12 has an inverted trapezoidal shape, i.e., the width of each trench 12 at its top is greater than that at its bottom. The trenches 12 with such a cross sectional shape can result in a good filling shape of a dielectric material and can achieve the improvement of rounding phenomena at its upper corners.

A method of manufacturing the SiGe HBT shown in FIG. 1 includes the following steps:

etching a substrate 11 to form two inverted-trapezoid-shaped trenches 12 by, for example, a shallow trench isolation (STI) process;

forming inner sidewalls in the trenches 12 and forming a pseudo buried layer 13 under the bottom of each trench 12 by using an ion implantation process, and removing the inner sidewalls in the trenches;

filling the trenches 12 with a dielectric material;

forming a collector region 14 in the portion of the substrate 11 between the two trenches 12 by using an ion implantation process;

depositing a first dielectric layer 15 and forming a base window therein, and epitaxially growing a SiGe material and forming a T-shaped poly SiGe base region 16 by using an etching process;

depositing a second dielectric layer 17 and forming an emitter window therein, and depositing a polysilicon material and forming a T-shaped polysilicon emitter 18 by using an etching process;

depositing a dielectric material 19 and forming emitter-region sidewalls 19a and base-region sidewalls 19b by using a dry etching process;

depositing a third dielectric layer (namely, the interlayer dielectric) 113, and etching it to form a first hole 110, second holes 111 and third holes 112 and making them contact with the T-shaped polysilicon emitter 18, the T-shaped poly SiGe base region 16 and the pseudo buried layers 13, respectively.

As each trench 12 has an inverted-trapezoidal-shaped cross section and the inner sidewalls formed in it are relatively thin, the energy of the implantation process for forming the pseudo buried layers 13 is greatly limited. In order to prevent ions from being implanted to penetrate the inner sidewalls of the trenches 12 and thus reach any of its inner side faces, a low-energy implantation process must be adopted, which can hardly meet the demand for a relatively high energy implantation to form pseudo buried layers 13 for a high-voltage SiGe HBT and thus will affect performance of the device.

As a low-energy ion implantation process is adopted to form the pseudo buried layers 13, it is difficult to achieve a lateral connection between the pseudo buried layers 13 within the active region through lateral diffusion. Moreover, it is impractical to adopt an annealing process to realize the lateral connection between the pseudo buried layers 13, as the annealing process will also cause the pseudo buried layers 13 to diffuse toward the surface of the collector region 14 and thus will affect the performance of the device.

SUMMARY OF THE INVENTION

An objective of the present invention is to provide a silicon-germanium (SiGe) heterojunction bipolar transistor (HBT) having a deep pseudo buried layer, which serves as buried layers for the collector region and is used to pick up the collector region through deep contact holes. To this end, the present invention is also to provide a manufacturing method of the SiGe HBT.

To achieve the above objective, the present invention provides a SiGe HBT which includes: a silicon substrate; trenches formed in the substrate, each having an isolation structure formed therein; first pseudo buried layers, each being formed under a bottom of one of the trenches; second pseudo buried layers, each being formed under and in contact with one of the first pseudo buried layers, the second pseudo buried layers being laterally connected to each other; and a collector region surrounded by the trenches, the first pseudo buried layers and the second pseudo buried layers.

According to a preferred embodiment, the first pseudo buried layers are not laterally connected to each other.

According to a preferred embodiment, each of the trenches has a cross sectional shape of trapezoid, which is narrow at top and wide at bottom.

To achieve the above objective, the present invention also provides a method of manufacturing SiGe HBT. The method includes:

etching a substrate to form trenches therein;

forming a first pseudo buried layer and a second pseudo buried layer under the bottom of each of the trenches by performing ion implantation processes, the second pseudo buried layer being located under and vertically contacting with the first pseudo buried layer, and the second pseudo buried layers being laterally connected to each other;

forming an isolation structure in each of the trenches; and performing an ion implantation process to the substrate between the trenches to form a collector region therein, the collector region being surrounded by the trenches, the first pseudo buried layers and the second pseudo buried layers.

The SiGe HBT having a deep pseudo buried layer of the present invention is capable of reducing the current amplification coefficient of a parasitic transistor consisted of the base region, the collector region and the substrate, of the SiGe HBT, reducing the series resistance of the collector region, and lowering the saturation voltage drop of the SiGe HBT, and thus capable of improving the performance of the device. Moreover, the manufacturing method of the SiGe HBT of the present invention is simple and procedures included therein are reasonably arranged. These features are conductive to facilitate its rapid implementation.

DETAILED DESCRIPTION

Figure 1:
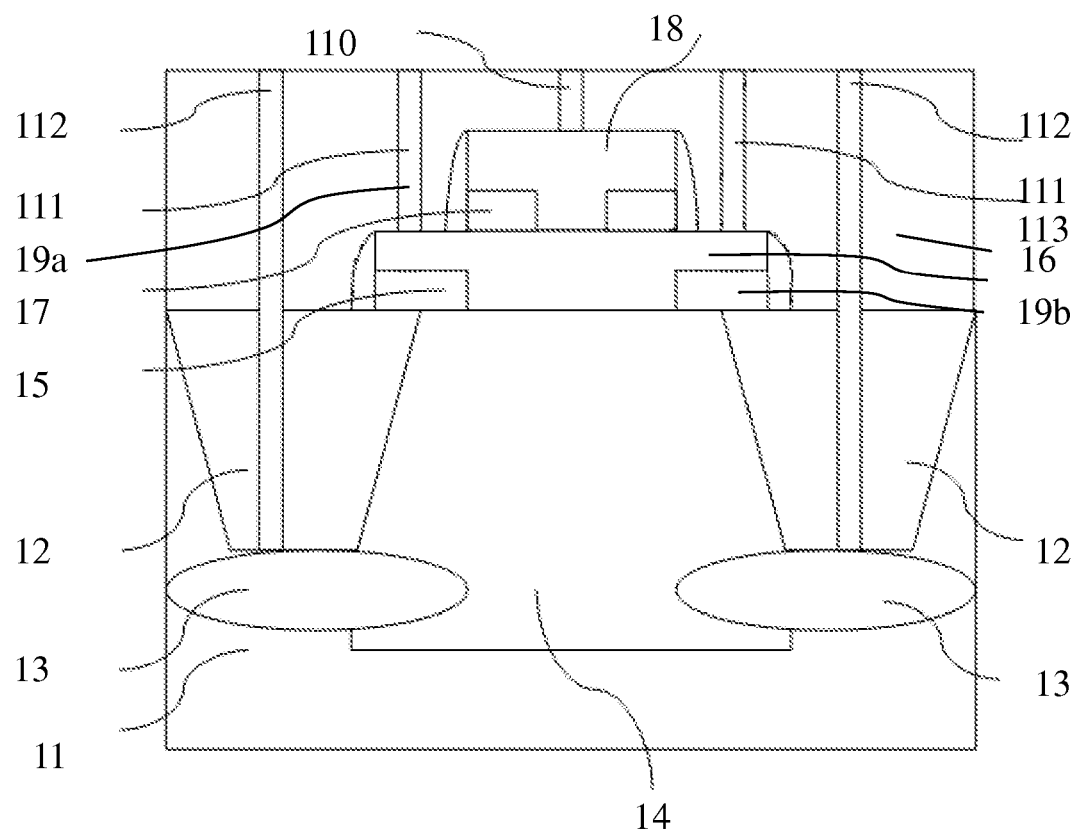
FIG. 1 is a schematic illustration of a SiGe HBT of the prior art.
Figure 2:
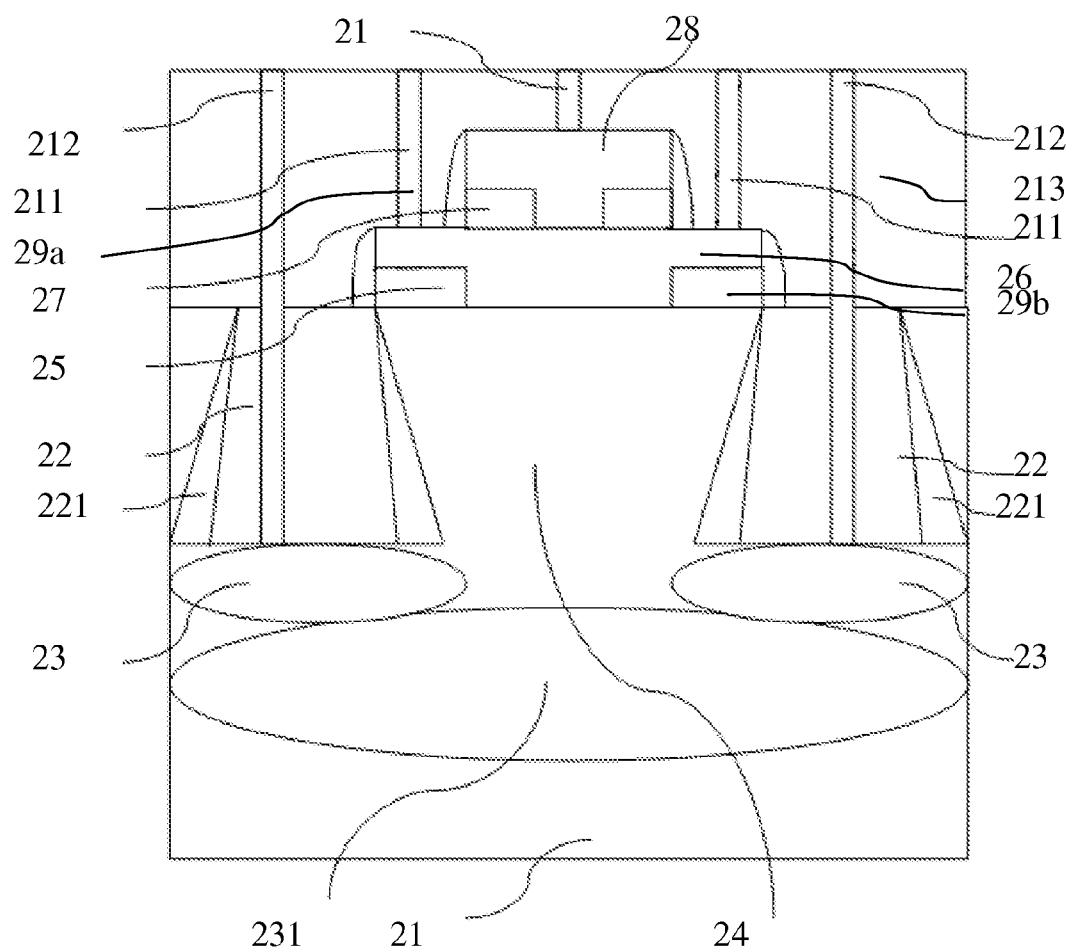
FIG. 2 is a schematic illustration of the structure of a SiGe HBT according to the present invention.

FIG. 2 illustrates the structure of a silicon-germanium (SiGe) heterojunction bipolar transistor (HBT) constructed according to an embodiment of the present invention. The device has a structure as follows: trenches 22 are formed in a substrate 21; inner sidewalls 221 are formed over inner side faces of each trench 22 and each trench 22 is filled with a dielectric material which serves as an isolation structure; under the bottom of each trench 22, a first pseudo buried layer 23 and a second pseudo buried layer 231 are formed, and each first pseudo buried layer 23 and its corresponding second pseudo buried layer 231 are vertically connected to each other; the two second pseudo buried layers 231 are connected to each other laterally; a collector region 24 is surrounded by the two trenches 22, the two first pseudo buried layers 23 and the two second pseudo buried layers 231; first dielectric portions 25 and a T-shaped SiGe base region 26 are formed above the collector region 24, and the first dielectric portions 25 are located under respective two extending portions of the T-shaped SiGe base region 26; a base-region sidewall 29b is formed above each of the isolation structure, on each outer side of the first dielectric portions 25 and the T-shaped SiGe base region 26; second dielectric portions 27 and a T-shaped polysilicon emitter region 28 are formed on the T-shaped SiGe base region 26, and the second dielectric portions 27 are located under respective two extending portions of the T-shaped polysilicon emitter region 28; an emitter-region sidewall 29a is formed above the T-shaped SiGe base region 26, on each outer side of the second dielectric portions 27 and the T-shaped polysilicon emitter region 28; a third dielectric layer (also referred to as an interlayer dielectric) 213 is formed on the surface of the substrate, and a first hole 210, two second holes 211 and two third holes 212, each being filled with a metal electrode, are formed in the third dielectric layer 213; the emitter 28 is in contact with the electrode within the first hole 210; the SiGe base region 26 is in contact with the electrode within the second holes 211; and the first pseudo buried layers 23 are in contact with the electrode within the third holes 212.

The SiGe HBT of the present invention has characteristics as follows.

First, because generally SiGe HBTs are neither used in narrow devices nor involve a gate oxidation process, there is no need to consider the issue of corner rounding of the isolation structures formed in the trenches during the fabrication of a SiGe HBT. Just by taking advantage of such feature of the SiGe HBT, the present invention proposes a regular-trapezoidal-shaped cross section for the trenches 22, namely, the width of each trench 22 at its top is smaller than that at its bottom, to ensure that inner side walls of the trenches 22 will not be doped during ion implantation processes for forming the pseudo buried layers 231 and 23, and therefore the performance of the SiGe HBT will not be affected. Preferably, the cross section of each trench 22 has an isosceles trapezoidal shape.

Second, as the second pseudo buried layers 231 are laterally connected to each other and thus integrated into one, they can jointly serve as a deep pseudo buried layer for the collector region 24. As the inner side walls of the trenches 22 will not be doped during ion implantation processes, it is practical to adopt a higher energy for ion implantation processes for forming the pseudo buried layers 231, 23, and to adopt an annealing process for facilitating the lateral diffusion of the pseudo buried layers 231, 23 after they are formed by the implantation processes. By adopting a higher energy of ion implantation, the second pseudo buried layers 231 (the deep buried layer) can be formed at a depth much farther from the surface of the active region (namely, the surface of the collector region), and therefore, their influence on the device will be further reduced. Moreover, as the second pseudo buried layers 231 are laterally connected to each other, the current amplification coefficient of a parasitic transistor consisted of the base region, the collector region and the substrate of the SiGe HBT can be reduced, and also the series resistance of the collector region can be reduced, and the saturation voltage drop of the SiGe HBT can be lowered.

Third, as the isolation structures in the trenches 22 are formed after the formation of the inner sidewalls 221, and preferably, the spare space within each trench 22 after the inner sidewalls 221 are formed has a width at its bottom a bit smaller than that at its top, the regular-trapezoidal-shaped trenches 22 can be completely filled with dielectric material to form isolation structures therein without leaving voids at the lower corners of the trenches.

The collector region 24 is surrounded by the two trenches 22, two first pseudo buried layers 23, and the two second pseudo buried layers 231. The collector region 24 has a depth greater than that of each of the trenches 22.

The method of manufacturing the SiGe HBT of the present invention includes the following steps 1 to 8.

Figure 3A:
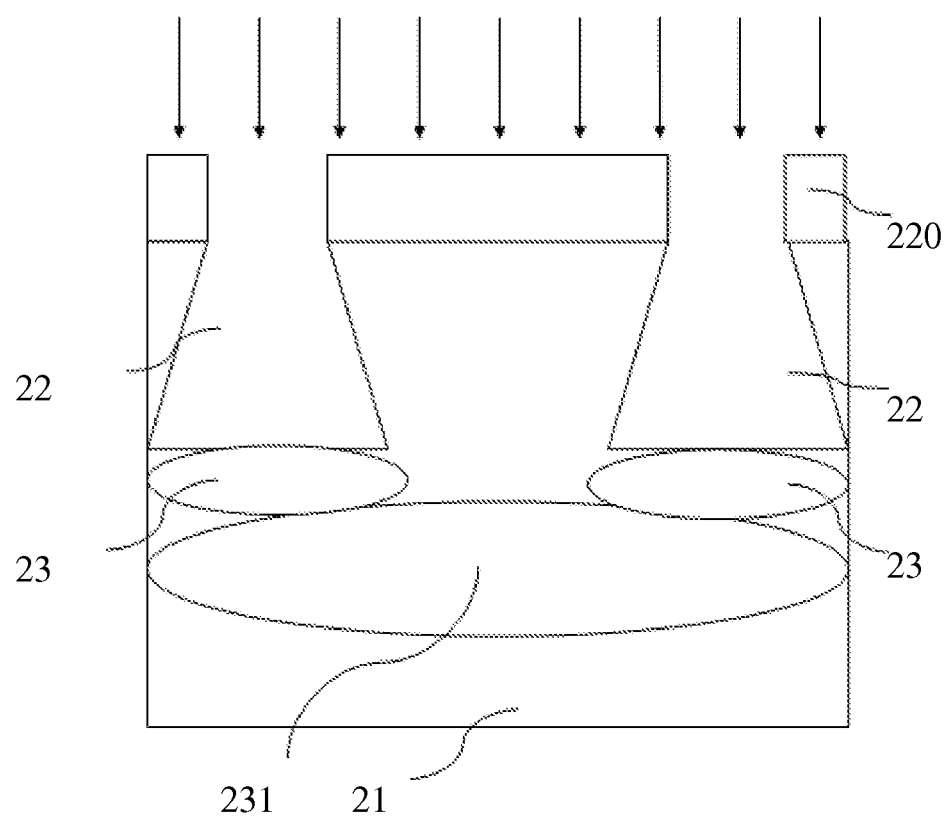
FIGS. 3a to 3e schematically illustrate structures in various steps of a method of manufacturing the SiGe HBT according to the present invention.

Step 1: as shown in FIG. 3a, a semiconductor substrate (generally, a silicon substrate) 21 is etched to form trenches 22 therein, the cross section of which has a regular trapezoidal shape, i.e., the width of each trench 22 at its top is smaller than that at its bottom.

Optionally, a hard mask layer 220 is deposited on the substrate 21 before forming the trenches. The hard mask layer 220 may be formed of a dielectric layer consisted of one or more selected from the group consisting of $SiO_2$, $Si_3N_4$ and $SiO_xN_y$ (where x and y are both natural numbers). Its thickness depends on the energy of ion implantation processes for forming the pseudo buried layers. In other words, the hard mask layer 220 should be thick enough to completely block the ions implanted during the process of forming the pseudo buried layers. After depositing the hard mask layer 220, the trenches 22 are formed in the substrate 21 by using lithographic and etching processes.

Preferably, a shallow trench isolation (STI) process is adopted to form the trenches 22.

Preferably, the cross section of each trench 22 has an isosceles trapezoidal shape.

Preferably, the angle between each inner side face and the bottom surface is 80 degrees to 90 degrees for each of the trenches 22.

Step 2: still referring to FIG. 3a, a first pseudo buried layer 23 and a second pseudo buried layer 231, which contact with each other vertically, are formed under the bottom of each trench 22 by using ion implantation processes. Each second pseudo buried layer 231 is located under a corresponding first pseudo buried layer 23. The two second pseudo buried layers 231 formed under respective bottoms of the two trenches 22 are laterally connected to each other.

Optionally, a portion of the bottom region of each trench 22 is coated with photoresist in advance by using a lithographic process, and the second pseudo buried layers 231 are formed by using ion implantation processes on the remaining parts of each trench 22. Next, ion implantation processes are performed on the portion of the bottom region of each trench 22 that is not covered by the photoresist to form the first pseudo buried layers 23. In these processes, the implantation energy determines the range of implanted ions, namely, the total distance traveled by ions within the substrate. In order to form two pseudo buried layers under the bottom of each trench 22, which has different distances from the bottom of the trench, at least two ion implantation processes with different implantation energies should be adopted in this step.

Preferably, the ion implantation processes are performed in steps and under conditions as follows:

First, an ion implantation process with a higher energy and thereafter an annealing process are carried out. After being annealed, the formed two ion implanted regions laterally diffuse and then are connected to each other, forming the two second pseudo buried layers 231 in the substrate 21.

Next, an ion implantation process with a lower energy and thereafter optionally an annealing process are carried out. The ion implanted regions are closely adjacent to the bottom of the trenches 22 to form two first pseudo buried layers 23, which are used for forming ohmic contacts with deep hole electrodes to be formed in a subsequent step, above these two first pseudo buried layers 231. The first pseudo buried layers 23 may be formed by performing one or more times of the ion implantation processes.

Both the second pseudo buried layers 231 and the first pseudo buried layers 23 have a doping type opposite to that of the substrate 21.

Figure 3B:
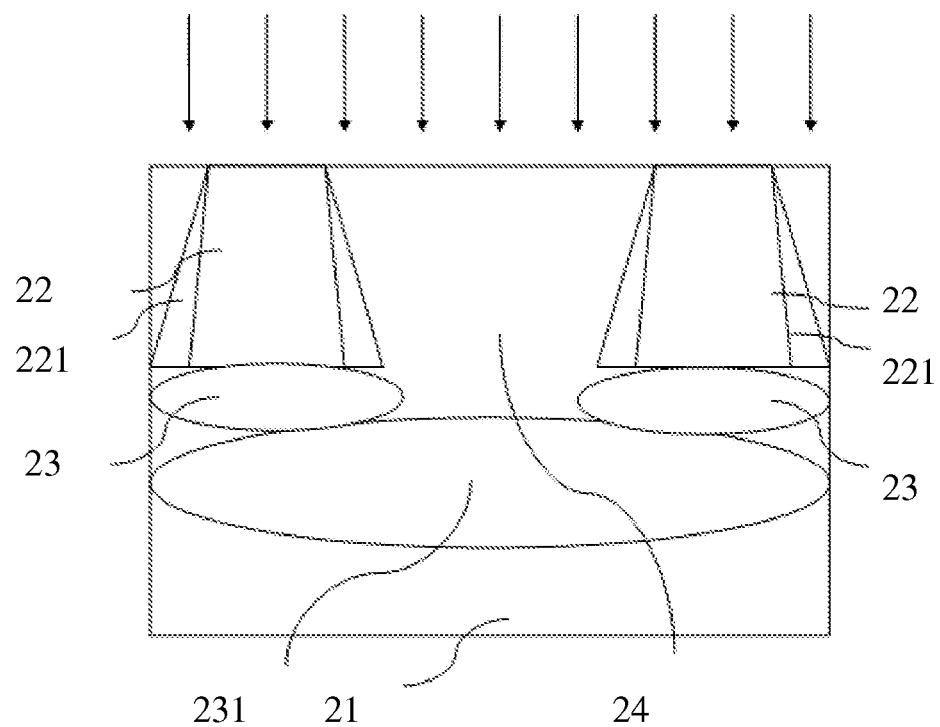

Step 3: as shown in FIG. 3b, inner sidewalls 221 are formed in the trenches 22, and each trench 22 is filled with a dielectric material to form an isolation structure.

The inner sidewalls 221 are formed by an existing process, simply described as follows. First, a layer of silicon oxide is optionally grown over inner side faces and bottoms of the trenches 22 as a pad oxide layer by using a thermal oxidation method. Next, a dielectric layer, which is preferred to be silicon oxide, is deposited into the trenches 22 (or over the whole surface of the substrate), such that the dielectric layer covers the inner side faces and bottoms of the trenches 22. After that, a dry etching process is carried out to the deposited dielectric layer until the silicon substrate at the bottoms of the trenches 22 (or the hard mask layer 220 formed on the substrate 21) is reached so as to remove the dielectric layer on bottoms of the trenches 22. After the etching process is completed, the inner sidewalls 221 are formed over inner side faces of each trench 22.

The trenches 22 are filled by using an existing process, such as an STI process, simply described as follows. First, a dielectric layer such as silicon oxide is deposited into the trenches 22 (or over the whole surface of the wafer), such that the dielectric layer fills the trenches 22 and is also deposited over the hard mask layer 220. Then the deposited dielectric layer is planarized by polishing it with a chemical mechanical polishing (CMP) process while taking the hard mask layer 220 as a polish-stop layer, such that the isolation structures are formed in the trenches 22.

Step 4: still referring to FIG. 3b, performing an ion implantation process to the portion of the substrate 21 between the two trenches 22 to form a collector region 24 therein.

In this step, if there is a hard mask layer 220 formed on the substrate 21, it should be removed at first by a wet etching process.

The conductive type of ions implanted to form the collector region 24 is the same with the doping type of the buried layers 231, 23.

Figure 3C:
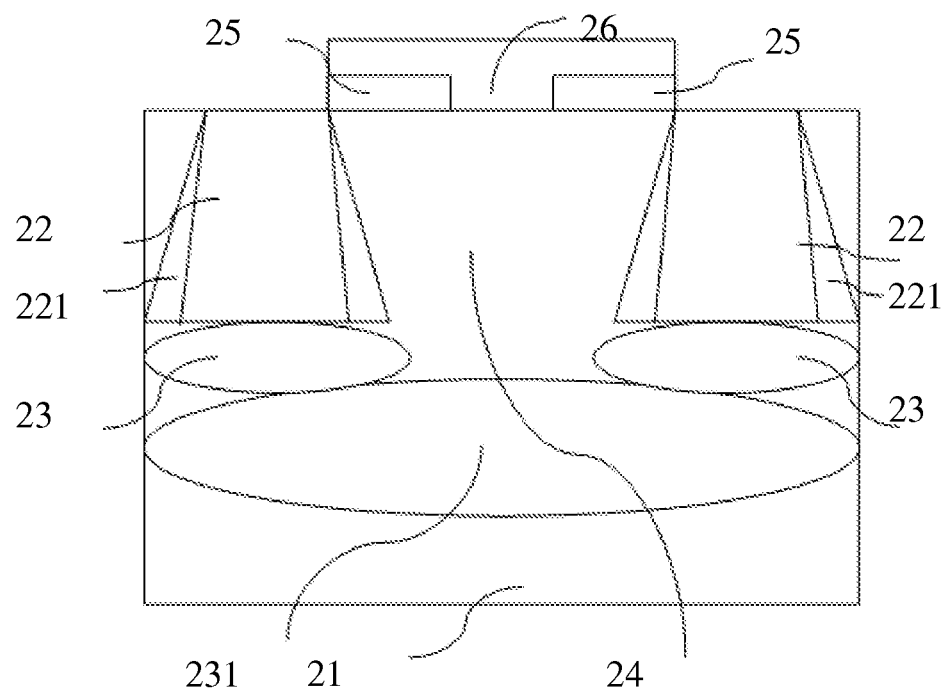

Step 5: as shown in FIG. 3c, a first dielectric layer 25 is deposited on the surface of the substrate and a base window is formed therein by using an etching process; after that, a layer of SiGe single crystal silicon 26 is epitaxially grown on the surface of the substrate; and thereafter the first dielectric layer and the SiGe single crystal silicon are etched, so as to only retain their portions located above the collector region 24.

The first dielectric layer 25 is formed of, for example, silicon oxide. As shown in FIG. 2, the base window is the area where the base region 26 and the collector region 24 contact with each other. After the etching process is completed, the base region 26, which has a T-shaped cross section, and two first dielectric portions 25 located under respective two extending portions of the T-shaped SiGe single crystal silicon base region 26 are formed.

The SiGe single crystal silicon base region 26 has a doping type opposite to that of the collector region 24.

Figure 3D:
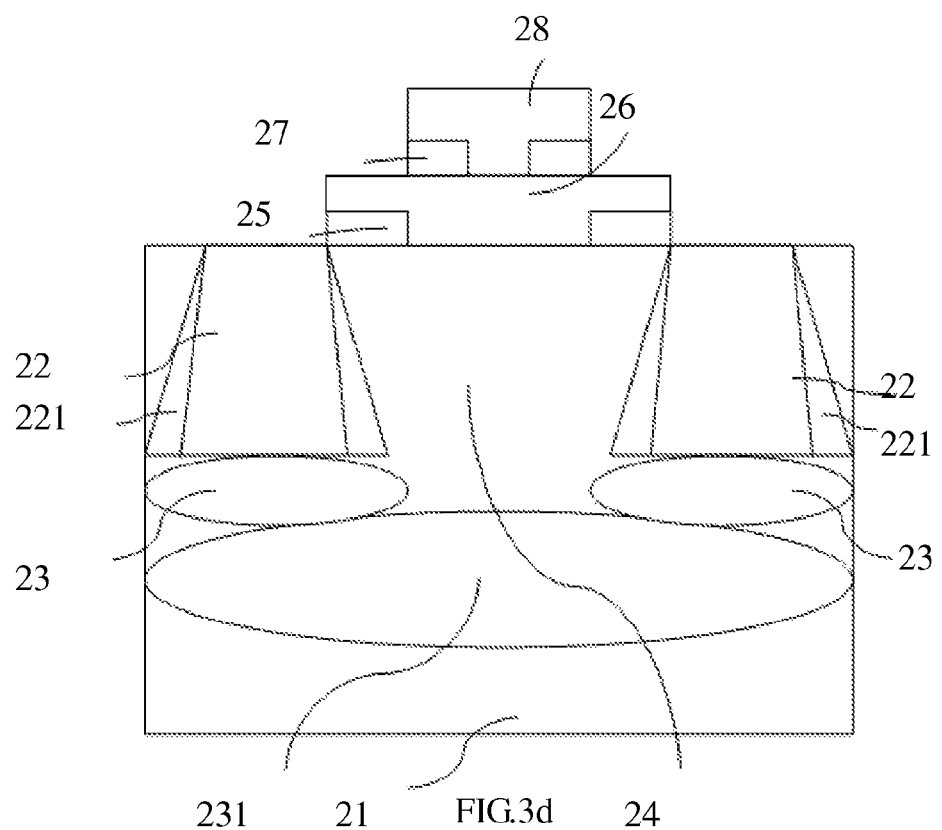

Step 6: as shown in FIG. 3d, a second dielectric layer 27 is deposited on the surface of the substrate and an emitter window is formed therein by using an etching process; after that, a layer of polysilicon 28 is deposited on the surface of the substrate; and thereafter the layers of the second dielectric layer 27 and polysilicon 28 are etched, so as to only retain their portions located above the area of the base window.

The second dielectric layer 27 is formed of one or more selected from the group consisting of silicon oxide, silicon nitride and silicon oxynitride. As shown in FIG. 2, the emitter window is the area where the emitter region 28 and the base region 26 contact with each other. After the etching process is completed, the emitter region 28, which has a T-shaped cross section, and two second dielectric portions 27 located under respective two extending portions of the T-shaped emitter region 28 are formed. The finish point of the above mentioned etching process is set, for example, at the upper surface of the SiGe base region 26.

The polysilicon 28 has a doping type opposite to that of the SiGe base region 26.

Figure 3E:
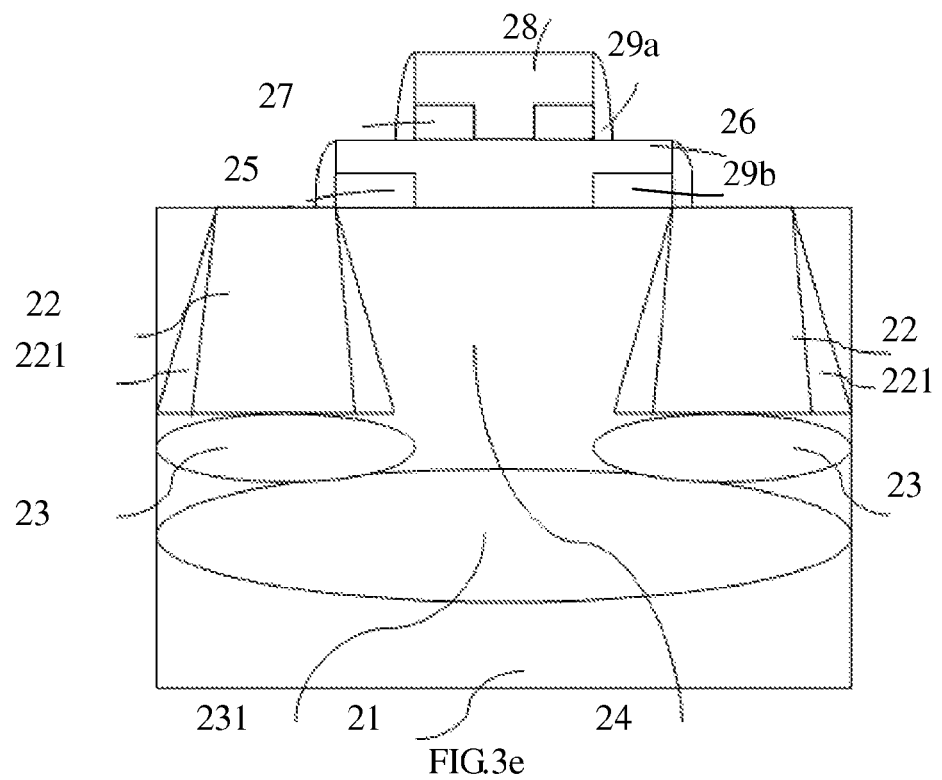

Step 7: as shown in FIG. 3e, emitter-electrode sidewalls 29a are formed on the SiGe base region 26, each covering one side face of a body composed of the emitter region 28 and the second dielectric portions 27; and also, base-region sidewalls 29b covering side faces of a body composed of the SiGe base region 26 and the first dielectric portions 25 are formed.

The sidewalls 29a and 29b are formed by using existing processes, simply described as follows. First, a layer of a dielectric layer 29, such as silicon oxide or silicon nitride, is deposited onto the surface of the substrate. Next, a dry etchback process is carried out to the deposited layer of the dielectric layer 29 until the SiGe base region 26 or the upper surfaces of the isolation structures within the trenches 22 is reached. After the etch-back process is completed, the sidewalls 29a and 29b are formed on both sides of a body composed of the emitter region 28 and the second dielectric portions 27, or a body composed of the SiGe base region 26 and the first dielectric portions 25.

Step 8: as shown in FIG. 2, a third dielectric layer 213 is deposited onto the surface of the substrate and is thereafter polished; after that, some holes are formed in the third dielectric layer by using etching processes, the holes including a first hole 210 contacting with the emitter 28, second holes 211 contacting with the SiGe base region 26, and third holes 212 contacting with the first pseudo buried layers 23; and at last, the holes are filled with a metal.

The third dielectric layer 213 is also referred to as an interlayer dielectric (ILD), which is formed of one or more selected from the group consisting of $SiO_2$, $Si_3N_4$ and $SiO_xN_y$, where x and y are both natural numbers. The surface of the third dielectric layer 213 is polished and planarized by using a CMP process or other planarization processes. The metal is filled into the holes by using, for example, a tungsten plug process. The emitter 28 is picked up by the electrode within the first hole 210; the base region 26 is picked up by the electrodes within the second holes 211; and the collector region 24 is picked up by the second pseudo buried layers 231, the first pseudo buried layers 23 and the electrodes within the third holes 212.

While preferred embodiments have been presented in the foregoing description of the invention, they are not intended to limit the invention in any way.

Those skilled in the art can make various modifications and variations without departing from the spirit or scope of the invention. Thus, it is intended that the present invention embraces all such alternatives, modifications and variations of this invention.

What is claimed is:

1. A silicon-germanium (SiGe) heterojunction bipolar transistor (HBT), comprising:
    a silicon substrate;
    trenches formed in the substrate, each having an isolation structure formed therein;
    first pseudo buried layers, each being formed under a bottom of one of the trenches;
    second pseudo buried layers, each being formed under and in contact with one of the first pseudo buried layers, the second pseudo buried layers being laterally connected to each other; and
    a collector region surrounded by the trenches, the first pseudo buried layers and the second pseudo buried layers.

2. The SiGe HBT according to claim 1, wherein the first pseudo buried layers are not laterally connected to each other.

3. The SiGe HBT according to claim 1, wherein each of the trenches has a cross sectional shape of trapezoid, which is narrow at top and wide at bottom.

4. The SiGe HBT according to claim 3, wherein each of the trenches has inner sidewalls formed therein; and the distance between the inner sidewalls at a bottom of the trench is smaller than a top width of the trench.

5. The SiGe HBT according to claim 3, wherein an angle between an inner side face and a bottom surface of each of the trenches is 80 degrees to 90 degrees.

6. The SiGe HBT according to claim 1, wherein the collector region has a depth greater than that of each of the trenches.

7. A method of manufacturing a silicon-germanium (SiGe) heterojunction bipolar transistor (HBT), according to claim 1, the method comprising:
    etching a substrate to form trenches therein;
    forming a first pseudo buried layer and a second pseudo buried layer under a bottom of each of the trenches by performing ion implantation processes, the second pseudo buried layer being located under and vertically contacting with the first pseudo buried layer, the second pseudo buried layers being laterally connected to each other;
    forming an isolation structure in each of the trenches; and
    performing an ion implantation process to the substrate between the trenches to form a collector region therein, the collector region being surrounded by the trenches, the first pseudo buried layers and the second pseudo buried layers.

8. The method according to claim 7 further comprising forming inner sidewalls in each of the trenches prior to forming the isolation structure in each of the trenches.

9. The method according to claim 7 further comprising:
    depositing a first dielectric layer on a surface of the substrate and forming a base window therein by etch; forming a doped SiGe single crystal silicon layer in the base window and on the first dielectric layer; and removing a portion of the SiGe single crystal silicon layer and a portion of the first dielectric layer, such that a remaining part of the SiGe single crystal silicon layer and remaining parts of the first dielectric layer cover the collector region only;
    depositing a second dielectric layer and forming an emitter window therein by etch; forming a polysilicon layer and removing a portion of the polysilicon layer and a portion of the second dielectric layer, such that a remaining part of the polysilicon layer and remaining parts of the second dielectric layer cover the base window only;
    forming sidewalls on both sides of the remaining part of the polysilicon layer and the remaining parts of the second dielectric layer, and forming sidewalls on both sides of the remaining part of the SiGe single crystal silicon layer and the remaining parts of the first dielectric layer; and
    depositing a third dielectric layer and polishing it; etching the third dielectric layer to form a first hole which is in contact with the remaining part of the polysilicon layer, second holes which are in contact with the remaining part of the SiGe single crystal silicon layer, and third holes which are in contact with the first pseudo buried layers; and filling these holes with a metal.

10. The method according to claim 7, wherein each of the trenches has a cross sectional shape of trapezoid, which is narrow at top and wide at bottom; an angle between an inner side face and the bottom surface of each of the trenches is 80 degrees to 90 degrees.

11. The method according to claim 7, wherein the first pseudo buried layers are formed by using one or more times of the ion implantation processes.

12. The method according to claim 7, wherein the collector region has a same doping type with the first and second pseudo buried layers.

13. The method according to claim 9, wherein the SiGe single crystal silicon layer has a doping type opposite to that of the first and second pseudo buried layers.

14. The method according to claim 9, wherein the second dielectric layer is formed of one or more selected from the group consisting of $SiO_2$, $Si_3N_4$ and SiON; and the third dielectric layer is formed of one or more selected from the group consisting of $SiO_2$, $Si_3N_4$ and $SiO_xN_y$, where x and y are both natural numbers.

15. The method according to claim 9, wherein the third dielectric layer is polished by using a chemical mechanical polishing (CMP) process or other planarization processes.

16. The method according to claim 9, wherein a tungsten plug process is adopted to fill the metal into the holes.

* * * * *